United States Patent
Carroll et al.

(10) Patent No.: US 6,195,579 B1
(45) Date of Patent: Feb. 27, 2001

(54) CONTRAST DETECTION AND GUIDED RECONSTRUCTION IN CONTRAST-ENHANCED MAGNETIC RESONANCE ANGIOGRAPHY

(75) Inventors: Timothy J. Carroll; Charles A. Mistretta, both of Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/215,755

(22) Filed: Dec. 18, 1998

(51) Int. Cl.[7] .................................................. A61B 5/055
(52) U.S. Cl. ................................... 600/420; 324/306
(58) Field of Search .................................. 600/420, 410, 600/419; 324/306, 309; 382/130

(56) References Cited

U.S. PATENT DOCUMENTS

| | | | |
|---|---|---|---|
| 5,713,358 | 2/1998 | Mistretta et al. | 128/653.2 |
| 5,713,359 * | 2/1998 | Dumoulin et al. | 128/653.2 |
| 5,827,187 * | 10/1998 | Wang et al. | 600/419 |
| 5,881,728 * | 3/1999 | Mistretta et al. | 128/653.4 |
| 5,924,987 * | 7/1999 | Meaney et al. | 600/420 |
| 6,052,476 * | 4/2000 | Qian et al. | 382/130 |
| 6,073,042 * | 6/2000 | Simonetti | 600/420 |

\* cited by examiner

Primary Examiner—Marvin M. Lateef
Assistant Examiner—Shawna J Shaw
(74) Attorney, Agent, or Firm—Quarles & Brady LLP (57) ABSTRACT

A dynamic MRA study is performed using a 3D fast gradient recalled echo pulse sequence. A signal strength indicator for each acquired k-space data set is calculated and these indicator values are employed to produce a contrast curve. This contrast curve is used to select data for use in forming a CONTRAST k-space data set and a MASK k-space data set. The MASK is subtracted from the CONTRAST data set and the result is used to reconstruct an image.

18 Claims, 7 Drawing Sheets

CONTRAST DETECTION AND GUIDED RECONSTRUCTION IN CONTRAST-ENHANCED MAGNETIC RESONANCE ANGIOGRAPHY

STATEMENT REGARDING FEDERALLY SPONSORED RESEARCH

This invention was made with government support under Grant No. HL57501 awarded by the National Institute of Health. The United States Government has certain rights in this invention.

BACKGROUND OF THE INVENTION

The field of the invention is magnetic resonance angiography ("MRA"), and particularly, dynamic studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged.

One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Earlier images in the sequence may not have sufficient contrast in the suspect vasculature, and later images may become difficult to interpret as the contrast agent reaches veins and diffuses into surrounding tissues. Subtractive methods such as that disclosed in U.S. Pat. No. 4,204,225 entitled "Real-Time Digital X-ray Subtraction Imaging" may be used to significantly enhance the diagnostic usefulness of such images.

Magnetic resonance angiography (MRA) uses the nuclear magnetic resonance (NMR) phenomenon to produce images of the human vasculature.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals, are digitized and processed to reconstruct the image using one of many well known reconstruction techniques.

To enhance the diagnostic capability of MRA a contrast agent such as gadolinium can be injected into the patient prior to the MRA scan. Several non-time resolved methods exist for coordinating acquisition of a single 3D image at peak arterial enhancement. In one method, a small test bolus of contrast agent is injected, and a time series of rapid 2D images are acquired. The 2D images are examined to determine the time when the contrast will arrive in the vessels of interest. The 2D temporal information is then used to delay the image acquisition relative to the injection of a full dose of contrast agent to achieve an optimal k-space acquisition. Similarly, flouro-triggering techniques use rapid 2D image acquisition to determine when the contrast is approaching the vessels of interest. When the monitor volume is seen to exhibit enhancement due to the contrast, the operator signals the scanner to switch from a 2D time series of images to a single high resolution 3D acquisition. Automatic triggering of the arrival of the contrast is also possible by acquiring an NMR projection and setting a threshold which switches the scanner to a 3D acquisition.

Single time frame 3D angiograms cannot display dynamic aspects of how blood vessels enhance, and therefore may lack some diagnostic information. If a particular angiogram contains blood vessels which fill later than others, in vessels distal to aneurysms for example, it is impossible to guarantee that both early and late filling vessels are optimally imaged.

An alternative method for acquiring angiograms is to acquire a series of "time resolved" volume images during the passage of the bolus of contrast agent. As described in U.S. Pat. No. 5,713,358, a series of images are acquired which depict the subject as the contrast agent enters the region being imaged. A reference image, or "mask," which depicts the subject before contrast agent arrives at the region of interest is subtracted from one of these images to remove the static tissues and further highlight the vasculature into which the contrast agent flows. The critical central k-space views are acquired every alternate time frame, thus assuring at least one set of central lines are acquired during peak contrast enhancement. The peripheral k-space lines are acquired less frequently and temporally interpolated in order to form a series of time resolved, 3D images. This method eliminates the need for timing the passage of the bolus of contrast, and this time-resolved method is thus less subject to operator error.

The current clinical implementation of this time-resolved method acquires either 15 or 20 high resolution 3D image frames. The large number of 3D volumes of data which are produced require significant computing power to reconstruct. Offline workstations are used for reconstruction, and typically reconstruct 10 time frames in no less than 1 hour for phased array data sets. There is no way, a priori, for the operator to know which time frame(s) will contain the peak arterial information. In addition, regions of k-space are combined without any knowledge of which regions were acquired during the peak of the contrast passage. Due to the long delay between acquisition of the data and display of the reconstructed images, physicians are not afforded the opportunity to review the results before the patient departs from the scanner.

SUMMARY OF THE INVENTION

The present invention is an improved method for performing contrast enhanced MR angiography. More specifically an NMR pulse sequence is repeatedly performed over a period of time after the injection of contrast to sample regions of k-space and produce a series of time-resolved k-space data sets; calculating a signal strength indicator for each of the k-space data sets to determine which were acquired when the contrast is optimal, and reconstructing an image using the optimal k-space data sets. It has been discovered that the enhancement due to contrast arrival can be detected directly from the acquired k-space data. This signal strength indicator calculation is very fast and it enables the optimal k-space data sets to be identified without lengthy image or projection reconstruction steps. As a result, the optimal time-resolved image frame is reconstructed quickly after the scan is completed.

Another aspect of the invention is to use the signal strength indicator calculations to produce an improved mask that can be subtracted from the optimal k-space data sets. A baseline strength indicator level is determined from the entire set of time-resolved data sets. This level defines a threshold which allows all precontrast time frames to be determined and averaged.

Yet another aspect of the invention is to employ the calculated signal strength indicators to select multiple optimal k-space data sets which may be combined before image reconstruction to improve image SNR.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE INVENTION

The present invention, is intended to provide real time feedback to physicians by forming and reconstructing an optimal single 3D time frame image while preserving multi-frame, temporal information for later review. This may be implemented as a post-processing technique, after a dynamic scan. The data acquired during the scan is selected and combined to form an optimal k-space data set used to reconstruct a single additional image. All the temporally interpreted time frames from the scan are still available. However, by combining several k-space time frames, we have been able to dramatically increase the signal-to-noise ratio, S/N, over the standard reconstruction.

This method has two parts, the first part detects the inflow of contrast and the second uses the contrast enhancement data to form and reconstruct the optimal single additional image. Typically, time-to-contrast information is determined by reconstructing a set of images, either 2D or 3D, and measuring the change in signal intensity in an operator specified region of interest. The present method determines the time-to-contrast curve directly from the raw NMR k-space data, prior to performing any CPU intensive image reconstruction. In the following example, a 3D time resolved acquisition in which the raw k-space data is segmented into three equal regions is discussed, however, it should be apparent that the present invention is not limited to a particular number of regions.

For each k-space data set acquired during the dynamic scan, a signal strength indicator using the in-phase and quadrature NMR signal components is calculated. This calculation may be done mathematically in a number of ways, but in the preferred embodiment, signal strength is calculated as the summation of the square root of the sum of the squares of the real and imaginary components of each k-space sample in the data set as follows:

$$\epsilon = \sum_{kx} \sum_{ky} \sum_{kz} \sqrt{\text{Real } (kx, ky, kz)^2 + \text{Imaginary } (kx, ky, kz)^2} \quad (1)$$

This calculation is performed for each region of k-space separately, and each may contain as many as $10^5$ data points which minimize the effect of random-uncorrelated noise in the measurement of $\epsilon$. Since image contrast is determined primarily by the central lines of k-space, summing over all of the $k_z$-lines may not be necessary, in fact a more efficient scheme which uses only the most central $k_z$ lines(s) may also be a viable implementation of this invention. Other calculations of signal strength indication are possible, and may include, for example, calculation of the signal energy in all or a portion of the k-space data set.

The value of $\epsilon$ is an indication of signal strength of the RF signal detected in the MR receiver coils. The value $\epsilon$ can be thought of as a measure of the "brightness" in the images, so that when the contrast agent flushes into the region and causes the vasculature to enhance, the value of $\epsilon$ will increase. Since the value of $\epsilon$ is determined from k-space data, which is the Fourier transform of the enhanced vasculature, the enhancement is the change in k-space due to the addition of the arterial image. The increase in the value of $\epsilon$ is frequency dependent, and thus the enhancement of $\epsilon$ will be different for each region of k-space. Another way of saying this is that for a given contrast injection, the change in ε measured in a central A-region of k-space will be different from the changes measured in peripheral B and C regions. This is demonstrated in FIG. 8 which shows the value of ε extracted from a time series of 3D k-space data sets. It can be seen that the central A and peripheral B and C regions enhance to a different degree during the passage of the bolus of contrast.

Figure 8:
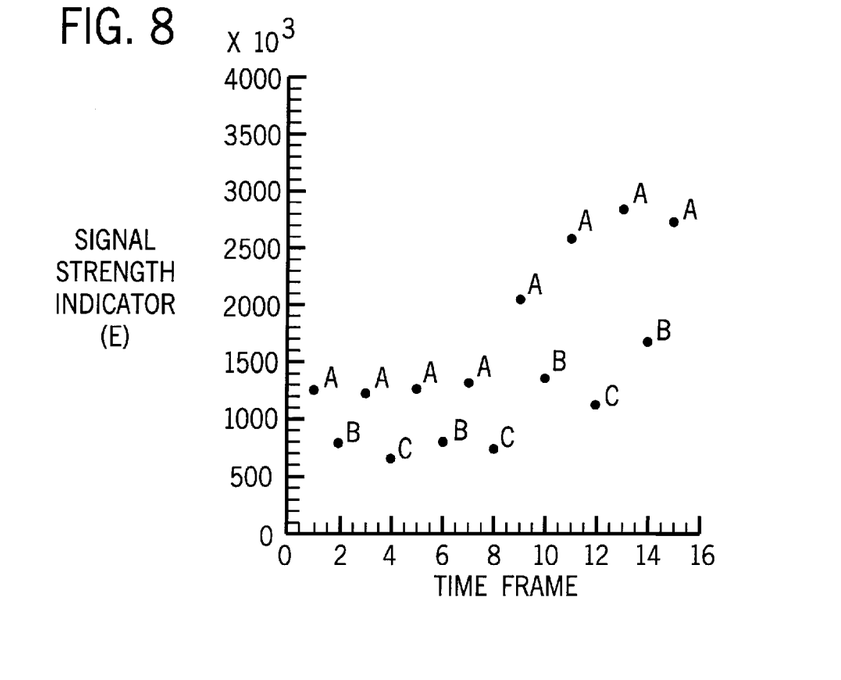
FIG. 8 is a graphic representation of the signal strength indicator in three separate k-space regions during an exemplary dynamic scan.
Figure 9:
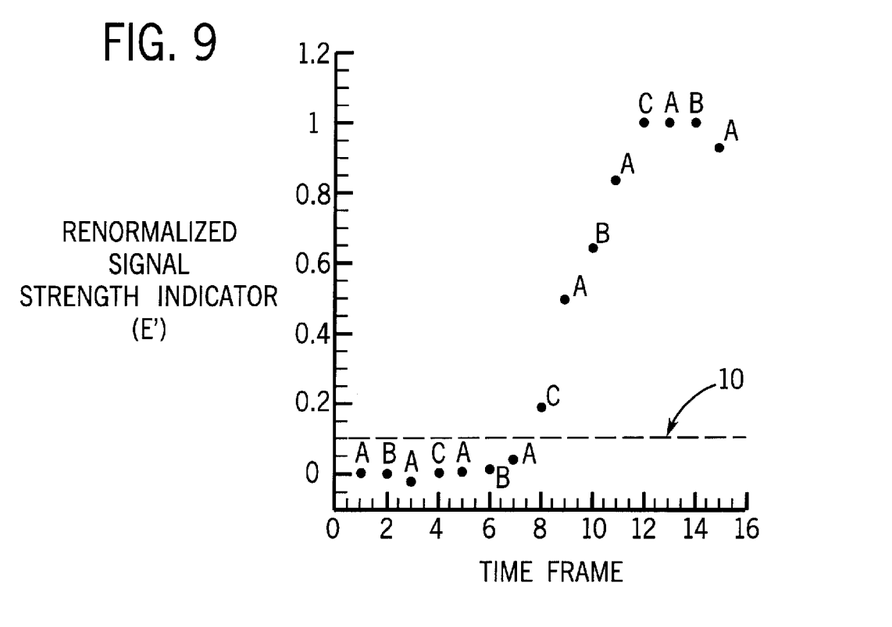
FIG. 9 is a graphic representation of a contrast curve formed by renormalizing the exemplary signal strength indicators in FIG. 8.

In order to account for the region dependent ε enhancement, the value of ε for each time resolved k-space data set is renormalized. The enhancement of the A, B and C k-space regions are considered separately, and the renormalized value, ε' is calculated as follows:

$$\epsilon' = \frac{\epsilon - \epsilon(mask)}{\epsilon(max) - \epsilon(mask)} \quad (2)$$

Where ε is the calculated signal strength indicator for the k-space data set from equation (1), ε(max) is the largest value of calculated signal strength for the corresponding region A, B or C throughout the scan, and ε(mask) is pre-contrast signal strength for the corresponding A, B or C region. Currently ε(mask) is the first A, B or C k-space data set acquired in the scan. The renormalized ε' values for all the k-space data sets acquired during the exemplary scan of FIG. 8 is shown in FIG. 9. The uptake of contrast is clearly visible in this resulting "contrast curve".

Once the k-space contrast curve is determined, information from the contrast curve is used to reconstruct a single optimal time frame image. In one preferred method all pre-contrast k-space data sets are combined to form a single mask k-space data set for subtraction from an optimal k-space data set. The advantage of forming the mask from multiple pre-contrast k-space data sets is to increase the SNR.

By defining a mask threshold of 10% of the maximal contrast enhancement, all those frames which were acquired prior to the arrival of contrast are determined. By averaging all these k-space data sets, the pre-contrast mask will increase its SNR by $\sqrt{N}$ where N is the number of k-space data sets included.

$$MASK(k_A, k_B, k_C) = \quad (3)$$
$$\frac{1}{N_A}\sum_{\epsilon'(A)<0.10} k_A + \frac{1}{N_B}\sum_{\epsilon'(B)<0.10} k_B + \frac{1}{N_C}\sum_{\epsilon'(C)<0.10} k_C$$

In the example shown in FIG. 9, the first seven acquired k-space data sets are below the mask threshold indicated by dashed line 10. These are combined so that the A-region of the mask is formed by combining (averaging) the 1st, 3rd, 5th and 7th time frames. The 2nd and 6th time frames are combined to form the mask's B-region and since the 4th time frame is the only C-region acquired prior to the arrival of contrast, averaging in this case is not possible and only one C-region will contribute to the mask.

In regions of the body where the enhancement of vasculature occurs slowly, a single time frame image may be formed by averaging the k-space data sets in which arteries are enhanced by the contrast agent. Using the calculated contrast curve the frames of k-space data acquired above a post contrast threshold are selected. A post contrast image frame, CONTRAST ($k_A$, $k_B$, $k_C$), is formed by combining and averaging in a manner similar to the way the MASK was formed.

$$CONTRAST(k_A, k_B, k_C) = \quad (4)$$
$$\frac{1}{N_A}\sum_{\epsilon'(A)>0.10} k_A + \frac{1}{N_B}\sum_{\epsilon'(B)>0.10} k_B + \frac{1}{N_C}\sum_{\epsilon'(C)>0.10} k_C$$

The final optimal k-space data set is formed by subtracting the k-space MASK data set from the k-space CONTRAST data set:

$$IMAGE(k_A, k_B, k_C) = CONTRAST(k_A, k_B, k_C) - MASK(k_A, k_B, k_C) \quad (6)$$

Finally the IMAGE is reconstructed by performing a 3DFT. The reconstructed 3D image includes information from the entire time series of images. Because multiple time frames have been used in both the mask and the contrast-enhanced k-space averages, there is an increase in image quality as measured by the SNR.

In another embodiment of the invention, the k-space data sets for the separate regions of k-space can be combined using a "Matched Filter" method. This preferred method combines acquired k-space data sets by multiplying, or weighting, the data by the difference between the mean signal energy value $\epsilon'_{mean}$ and the renormalized signal energy value of the particular k-space data set.

$$IMAGE(k_A, k_B, k_C) = \quad (7)$$
$$\sum_{N_A}\omega(N_A) \times k_A + \sum_{N_B}\omega(N_B) \times k_B + \sum_{N_C}\omega(N_C) \times k_C$$

The weights are calculated as, $$W = \epsilon'_{mean} - \epsilon' \quad (8)$$

with, $$\epsilon'_{mean} = \frac{1}{N_{frames}}\sum_{all\ frames} \epsilon'. \quad (9)$$

As discussed previously, each region of k-space will enhance by different amounts. In order to implement the matched filter in k-space the matched filter weighting method is applied to the A, B and C regions independently. In effect each region of k-space is considered a separate time-series of acquired k-space data sets.

DESCRIPTION OF THE PREFERRED EMBODIMENT

Figure 1:
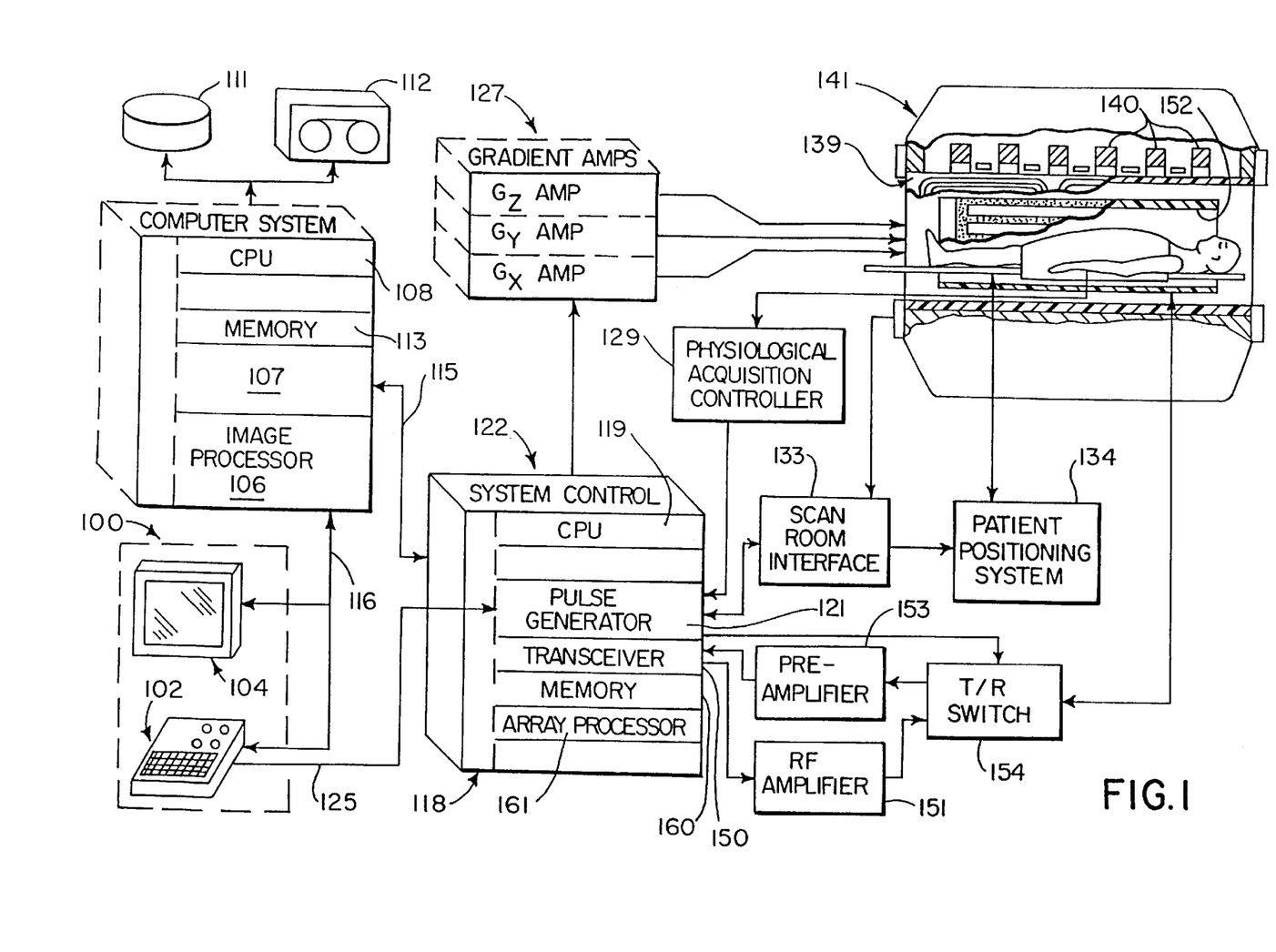
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
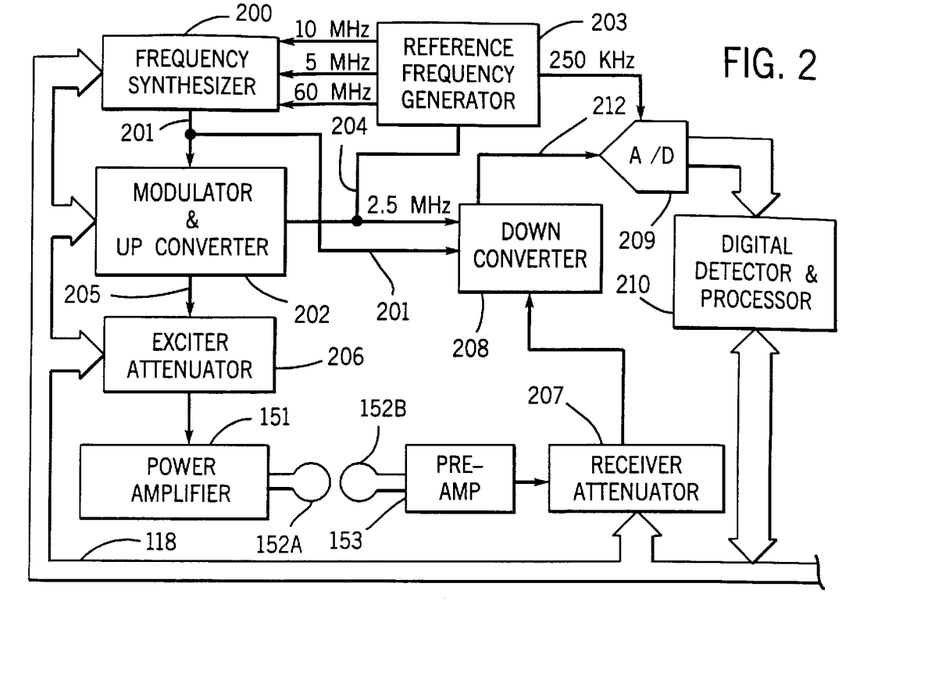
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image or to detect the arrival of contrast.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
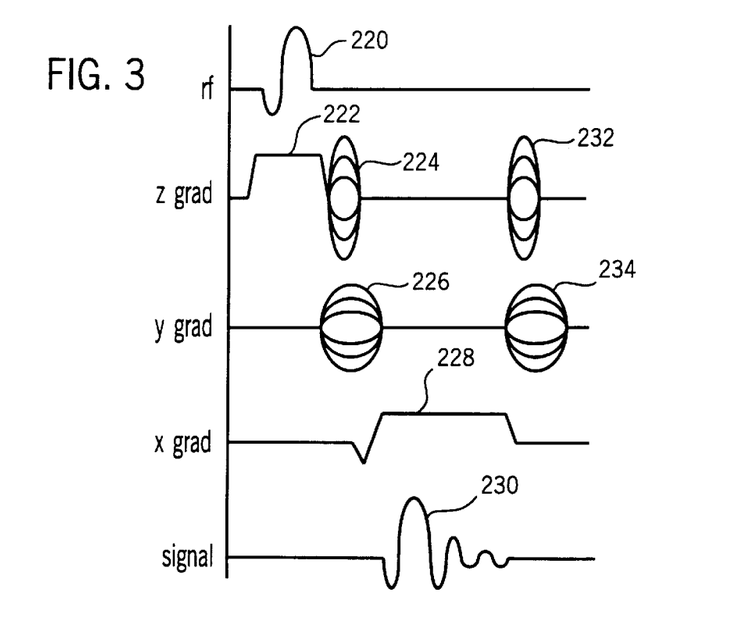
FIG. 3 is a graphic representation of the pulse sequence employed in the preferred embodiment of the invention.

Although the present invention can be used with a number of different pulse sequences, the preferred embodiment of the invention employs a 3D gradient recalled echo pulse sequence depicted in FIG. 3. The pulse sequence "3dfgre" available on the General Electric 1.5 Tesla MR scanner sold under the trademark "SIGNA" with revision level 5.5 system software was used. It was modified to collect data from multiple volumes so that the k-space sampling patterns discussed below can be practiced.

Referring particularly to FIG. 3, an RF excitation pulse 220 having a flip angle of 60° is produced in the presence of a slab select gradient pulse 222 to produce transverse magnetization in the 3D volume of interest as taught in U.S.

Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

Figure 4:
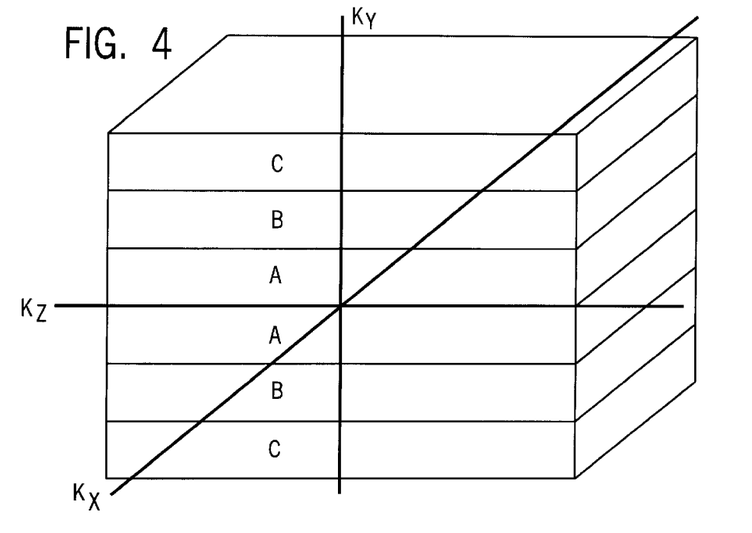
FIG. 4 is a graphic representation of three-dimensional k-space from which data is sampled when practicing the preferred embodiment of the invention.

As is well known in the art, the pulse sequence is repeated and the phase encoding pulses 224 and 226 are stepped through a series of values to sample the 3D k-space depicted in FIG. 4. In the preferred embodiment sixteen phase encodings are employed along the z axis and 128 phase encodings are employed along the y axis. For each particular y phase encoding, therefore, sixteen acquisitions with twelve different z phase encodings are performed to sample completely along the $k_z$ axis. This is repeated 128 times with 128 different y phase encodings to sample completely along the $k_y$ axis. As will become apparent from the discussion below, the order in which this sampling is performed is important.

Sampling along the $k_x$ axis is performed by sampling the echo signal 230 in the presence of the readout gradient pulse 228 during each pulse sequence. It will be understood by those skilled in the art that only a partial sampling along the $k_x$ axis is performed and the missing data is computed using a homodyne reconstruction or by zero filling. This enables the echo time (TE) of the pulse sequence to be shortened to less than 1.8 to 2.0 ms. and the pulse repetition rate (TR) to be shortened to less than 10.0 msecs.

Referring particularly to FIG. 4, to perform a dynamic study the k-space to be sampled is divided into regions. In the preferred embodiment the 3D k-space is divided into three regions designated "A–C". The boundaries of these regions A–C are disposed along the $k_y$ axis and are symmetrical about $k_y=0$. A central region "A" occupies the central k-space region and these "central" samples contain most of the information which determines the overall contrast in the reconstructed image. As will now be described, it is this central k-space region A which forms the basis for each frame image in the dynamic study and which determine the eventual temporal frame rate.

The remaining two "peripheral" k-space regions B and C are divided and disposed on opposite sides of the central region A. The central region of k-space is sampled at a higher rate than the peripheral regions during the dynamic study. In the preferred embodiment this is achieved by alternately sampling the central region A and one of the two peripheral regions. The following sampling sequence is thus performed during the dynamic study:

AB AC AB AC AB AC

Figure 5:
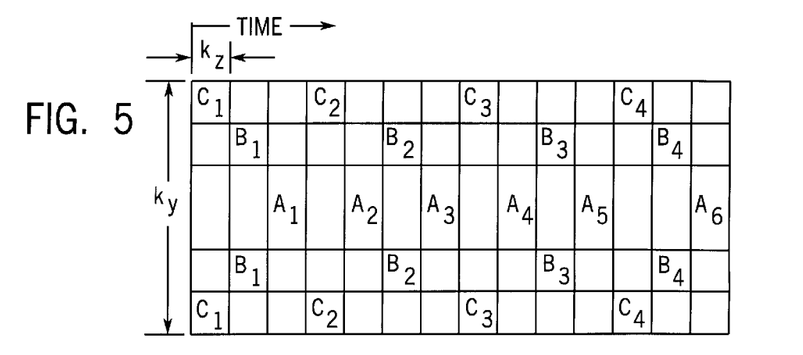
FIG. 5 is a graphic representation of the order in which the three-dimensional k-space of FIG. 4 is sampled.

This sampling sequence is shown graphically in FIG. 5, where the horizontal axis indicates real time during the dynamic study and the vertical axis is the region in k-space along the $k_y$ axis that is being sampled. The time periods during which each k-space region A–C is sampled are labeled, and the subscripts indicate the number of times the region has been sampled during the dynamic study. It is readily apparent that the central k-space region A is sampled at a higher temporal rate than the peripheral k-space regions B–C.

It can be appreciated by those skilled in the art that k-space can be carved up in other ways. For example, the number of regions can be changed and they can be oriented such that their boundaries are disposed along the slice-select $k_z$ axis. Also, k-space can be divided into a circular central region and a plurality of surrounding, annular-shaped peripheral regions.

The data acquired during the dynamic study can be used in a number of ways to reconstruct a series of frame images $F_1-F_n$ that depict contrast changes occurring during the dynamic study. In one embodiment illustrated in FIG. 6, image frames designated $F_1$ through $F_7$ are reconstructed using data from each central k-space region acquisition ($A_1-A_7$). This is accomplished by forming a data set sufficient to reconstruct a frame image using the particular central k-space region A data combined with temporally adjacent data from the surrounding, peripheral k-space regions B and C. Each image frame data set depicts the subject at a particular time during the dynamic study.

Figure 6:
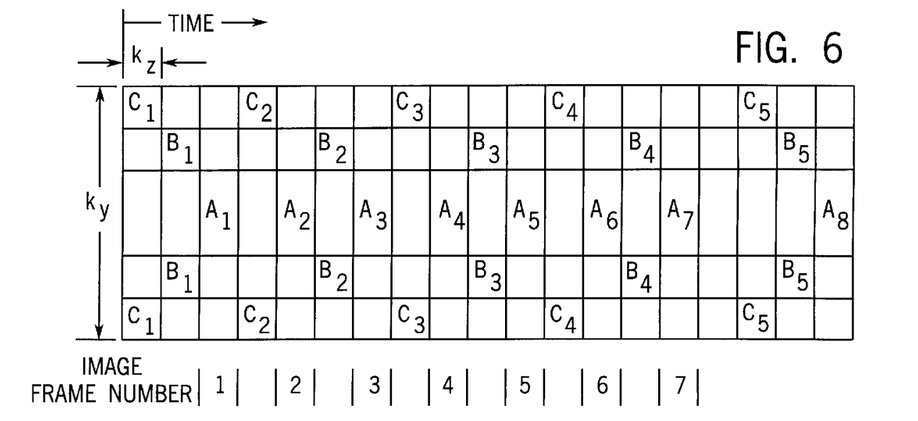
FIG. 6 is a graphic representation of the sampling of the three-dimensional k-space of FIG. 4 showing the times at which each image frame in the dynamic study is reconstructed according to one embodiment of the invention.

One method for forming each such image frame data set is to use the data acquired from peripheral regions closest in time to the acquisition of the central k-space region A. This method of selecting the data closest in time to that of the image frame is referred to herein as the "nearest neighbor" method. It can be appreciated that sometimes the nearest data for a peripheral region of k-space is close to the frame time, and in other cases the frame time is midway between two sample periods.

Another method for forming a data set at each frame $F_2$ through $F_6$ is to interpolate between the two adjacent sets of data acquired for each peripheral region. A linear interpolation method is used, however non-linear interpolation can also be used. For example, if a function indicative of the flow of contrast agent into the region of interest during the dynamic study is determined, this function can be used to weight the sampling done at different times during the study.

Figure 7:
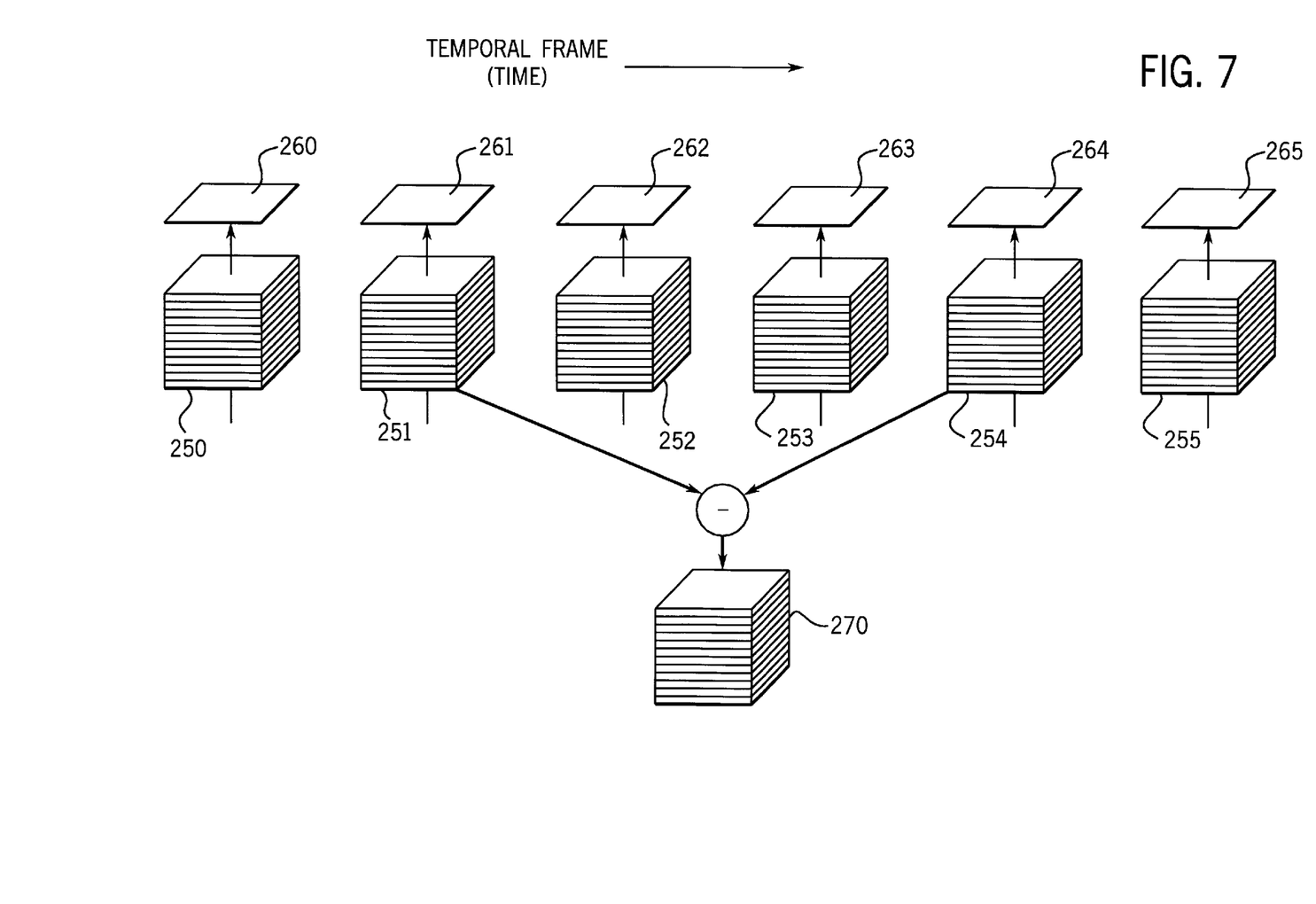
FIG. 7 is a pictorial representation of the data sets for each image frame in the dynamic study and how they are combined to produce an MRA image.

Regardless of how they are formed, the image frame data sets are employed to reconstruct a corresponding set of 3D frame images. In the preferred embodiment a three-dimensional Fourier transformation method is used to reconstruct each 3D frame image. Six such 3D frame images are shown in FIG. 7 as frame image data sets 250–255. Two of these image data sets may be selected by the physician and subtracted to form a 3D difference image 270. Unfortunately, all the 3D image must be reconstructed and examined to determine which two should be selected and the reconstruction of all the images requires considerable processing time.

While images may be produced simply by selecting a set of data points located in a cross section through one of the 3D data arrays 250–255, such images have limited diagnostic value. This is because blood vessels usually do not lie in a single plane and such cross sectional images show only short pieces or cross sections of many vessels that happen to pass through the selected plane. Such images are useful when a specific location in a specific vessel is to be examined, but they are less useful as a means for examining the health of the vascular system and identifying regions that may be diseased.

For assessing overall blood vessel structure and health it is more useful to project the 3D array of NMR data into a single 2D projection image to produce an angiogram-like picture of the vascular system. The most commonly used technique for doing this is to project a ray from each pixel in the projection image through the array of data points and select the data point which has the maximum value. The value selected for each ray is used to control the brightness of its corresponding pixel in the projection image. This method, referred to hereinafter as the "maximum pixel technique," is very easy to implement and it gives aesthetically pleasing images. It is presently the preferred method for viewing a 3D image.

The 2D projection images from each 3D image frame data set 250–255 is shown in FIG. 7 at 260–265. These may be viewed directly and used to observe the flow of contrast agent into the subject vasculature over the entire time course of the dynamic study. Unfortunately, the reconstruction and projection of all these 3D images and 2D projections require considerable time.

The present invention the series of k-space data sets acquired during the dynamic scan to be quickly processed to produce an image with optimal contrast. The steps are performed in the computer system 107 on raw k-space data received from the system control 122. A flow chart of the program used in the preferred embodiment is shown in FIG. 10.

Figure 10:
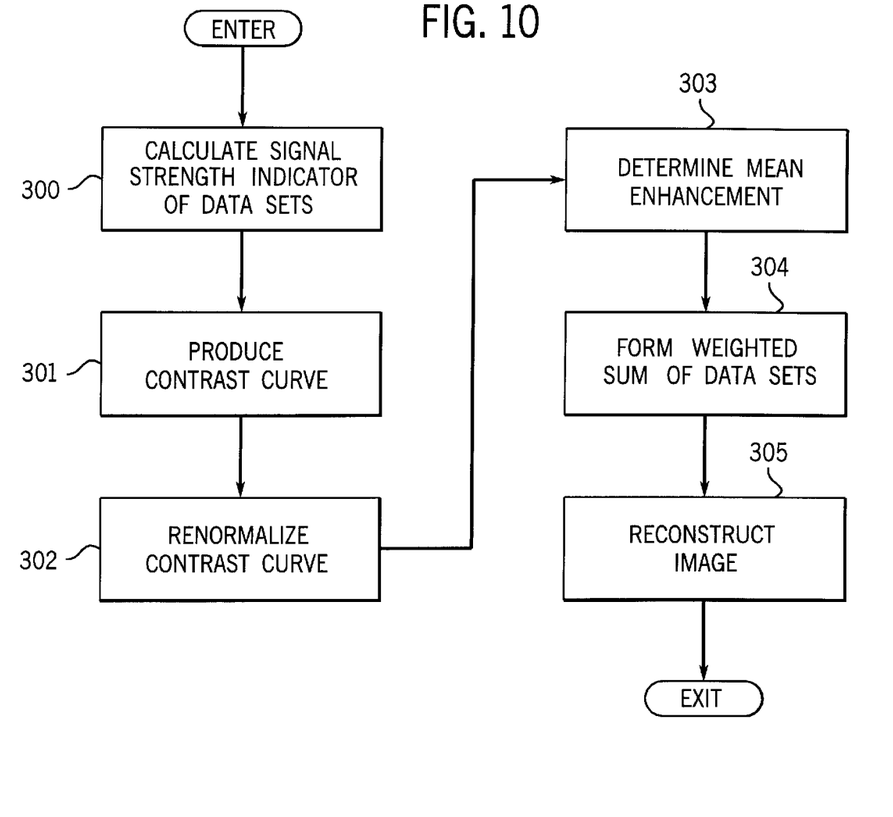
FIG. 10 is a flow chart of the preferred method for implementing the invention on the MRI system of FIG. 1.

Referring to FIG. 10, after the scan is complete the signal strength indicator (e) of each acquired k-space data set is calculated using Eq. 1 as indicated at process block 300. A contrast curve such as shown in FIG. 9 is then produced at process block 302 by renormalizing each signal strength indicator calculation using Eq. 2. From this contrast curve the mean value of the signal is determined using Eq. 8 as indicated at process block 303. The k-space data sets are combined by weighting using a multiplicative factor as calculated by Eq. 7 as indicated in process block 304. The resulting optimal three-dimensional k-space data set is then used to reconstruct an image as indicated at process block 305. This matched filter technique has been found to have the optimal signal-to-noise ratio, and it is easy to implement.

The entire procedure set forth in FIG. 10 can be performed automatically over a short time interval immediately following the scan. The complete set of data acquired during the dynamic study is available for later exhaustive study if needed, but the optimal image produced according to the present invention promptly provides the best clinical image in most cases. If for some reason the study should be repeated, this too is indicated promptly before the patient is dismissed.

Figure 11:
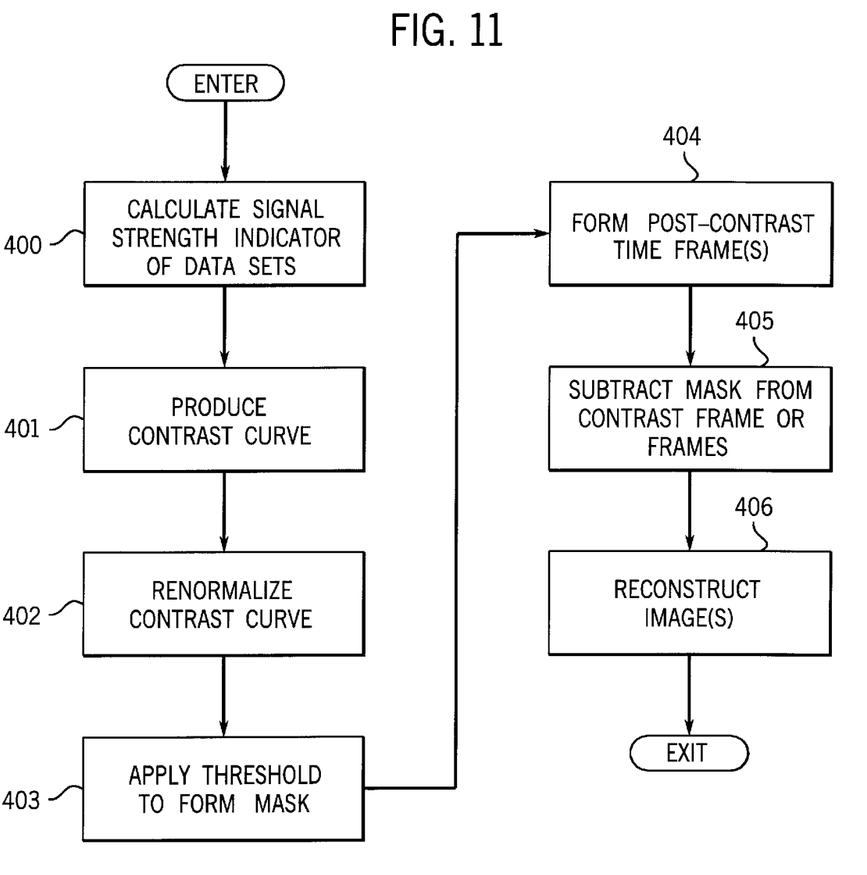
FIG. 11 is a flow chart of a second preferred method for implementing the invention on the MRI system of FIG. 1.

In those clinical situations where it is advisable to subtract the unenhanced tissue signal from the images, the value of $\epsilon'(t)$ can be used to determine a set of frames which were acquired prior to the arrival of the contrast agent in order to form a pre-contrast MASK k-space data set. Referring to FIG. 11 which illustrates this method, after the scan is complete the signal strength indicator ($\epsilon$) of each acquired k-space data set is calculated using Eq. 1 as indicated at process block 400. A contrast curve such as shown in FIG. 9 is then produced at process block 402 by renormalizing each signal strength indicator $\epsilon$ calculation using Eq. 2. All those A, B and C k-space segments acquired prior to the first frame which exhibits a value of $\epsilon'$ of less than a pre-defined threshold such as that shown by dashed line 10 in FIG. 9, are combined as per Eq. 3 to form a pre-contrast MASK data set as indicated at process block 403.

The MASK is then available for forming a single optimal time frame as will be described below, or used for pre-contrast subtraction from a time-series of images formed from the series of post-contrast time frames. Thus, the threshold MASK is retained as the optimal pre-contrast k-space data set for use in exams which require temporal information, such as those exams with late filling blood vessels or those exams which due to patient motion during the contrast uptake, have a restricted number of later time-frames which are viable.

A single post-contrast k-space data set, CONTRAST, is then formed as per Eq. 4 as indicated in process block 404. This is accomplished by selecting each of the A, B and C region k-space data sets which have a renormalized signal energy $\epsilon'$ above a preset post contrast threshold as indicated at process block 404. In the preferred embodiment this threshold is selected as 30% of the calculated peak energy, $\epsilon'(\text{maX})$.

As indicated at process block 405, the MASK k-space data set is subtracted from the CONTRAST k-space data set as set forth above in Eq. 5. The resulting three-dimensional k-space data set is then used to reconstruct an image as indicated at process block 406. Alternatively, the MASK k-space data set may be subtracted from a time series of k-space data sets.

Figure 12:
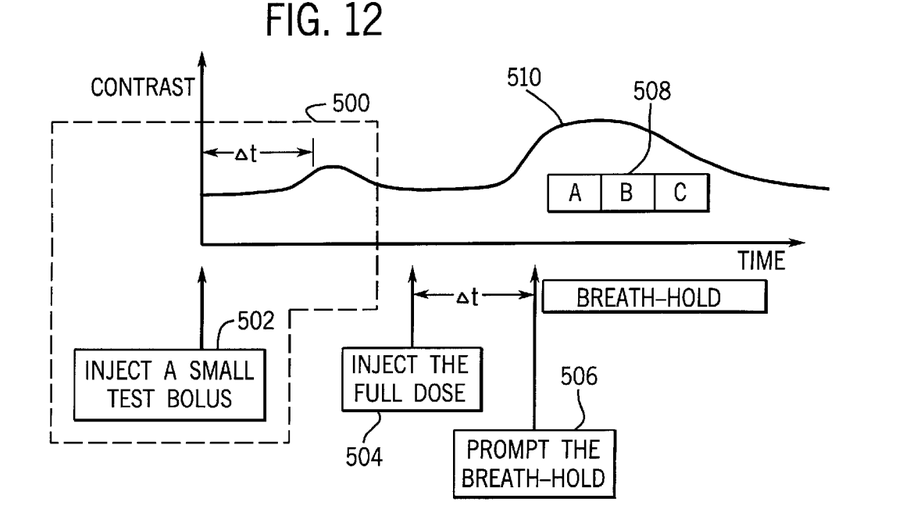
FIG. 12 is a graphic illustration of a third preferred method for implementing the invention on the MRI system of FIG. 1.

The present invention may also be employed to determine contrast bolus dynamics from a global estimate of the entire imaged volume. This estimate is then used to automatically coordinate the breath-hold, the contrast injection and an optimal k-space acquisition. Referring particularly to FIG. 12, a dynamic MRA study which employs the present invention is illustrated. This particular dynamic MRA study is used in abdominal imaging to automatically coordinate the injection of contrast material, initiation of breath-holding and acquisition of the 3D angiogram during the peak arterial signal. The first portion of the study indicated by dotted lines 500 measures the delay time ($\Delta t$) between the venous injection and contrast agent arrival in the region of interest. As indicated at block 502, a small test bolus of contrast agent is injected and a low resolution k-space data set A' is repeatedly acquired using the pulse sequence of FIG. 3. This k-space data set A' is from the central region of k-space, but because it is not used to reconstruct an image, its resolution, or k-space sampling rate, is less than the imaging central k-space region A discussed above. As a result, the k-space data sets A' can be rapidly obtained and used to quickly calculate the signal strength indicator $\epsilon$ as set forth above in Eq. 1.

The acquisition continues for a time sufficient to determine the time delay ($\Delta t$). The time delay ($\Delta t$) is determined by monitoring the calculated values $\epsilon$ and detecting when it exceeds a preset threshold. Because no time consuming Fourier transformations are required, the calculations of the signal strength indicator $\epsilon$ can be quickly calculated and used to detect bolus arrival.

The measured time delay ($\Delta t$) is employed by the pulse generator module to acquire a high resolution 3D angiogram. As indicated in FIG. 12 at block 504, a full dose of contrast agent is injected into the patient and after the time period $\Delta t$ has elapsed a message indicated at block 506 is produced directing the patient to start a breath-hold. Shortly thereafter a complete 3D k-space data set is acquired in centric view order as indicated at 508. The central region A of k-space is acquired first when the contrast enhancement indicated by curve 510 is at peak value.

What is claimed is:

1. A method for producing a contrast enhanced MRA image of a subject using an MRI system, the steps comprising:
    a) injecting a contrast agent into the subject;
    b) acquiring a series of k-space data sets over a period of time during which the contrast agent enters a region of interest in the subject being imaged;
    c) calculating a signal strength indicator for each k-space data set from k-space data therein;
    d) selecting a first k-space data set having a high calculated signal strength indicator to form a final k-space data set; and
    e) reconstructing an image using the final k-space data set.

2. The method as recited in claim 1 in which the signal strength indicator for a k-space data set is calculated by summing together the square root of the sum of the square of a real component and the square of an imaginary component for a set of k-space samples in the k-space data set.

3. The method as recited in claim 1 which includes:
 f) selecting a second k-space data set having a low calculated signal strength indicator; and
 g) subtracting the second k-space data set from the first k-space data set to form the final k-space data set.

4. The method as recited in claim 1 in which an additional k-space data set having a calculated signal strength indicator above a threshold amount is combined with the first k-space data set to form a CONTRAST k-space data set which is used to form the final k-space data set.

5. The method as recited in claim 4 which includes:
 f) selecting and combining together to form a MASK k-space data set a plurality of k-space data sets having calculated signal strength indicators below a second threshold amount; and
 g) subtracting the MASK k-space data set from the CONTRAST k-space data set to form the final k-space data set.

6. The method as recited in claim 1 which includes:
 producing a contrast curve using the calculated signal strength indicators of k-space data sets; and step d) is performed by selecting a k-space data set near the peak value indicated by the contrast curve.

7. The method as recited in claim 1 in which the acquired k-space data sets include: a plurality of central region k-space data sets that each contain k-space samples from a central region of k-space; and a plurality of peripheral region k-space data sets that each contain k-space samples from a peripheral region of k-space.

8. The method as recited in claim 7 which includes:
 renormalizing the calculated signal strength indicators for each acquired k-space data set; and
 producing a contrast curve using the renormalized signal strength indicators for k-space data sets; and
 step d) is performed by selecting a central region k-space data set and a peripheral k-space data set near a peak value in the contrast curve.

9. The method as recited in claim 7 in which the final k-space data set is formed by selecting a central region k-space data set having a high signal strength indicator and combining it with a selected peripheral region k-space data set having a high signal strength indicator.

10. The method as recited in claim 7 in which the final k-space data set is formed by averaging a plurality of central region k-space data sets having high signal strength indicators and combining it with the average of a plurality of peripheral region k-space data sets having high signal strength indicators.

11. The method as recited in claim 9 which includes:
 f) selecting a second k-space data set by combining a central region k-space data set having a low signal strength indicator with a peripheral region k-space data set having a low signal strength indicator; and
 g) subtracting the second k-space data set from the first k-space data set to form the final k-space data set.

12. The method as recited in claim 1 in which the image is reconstructed by Fourier transforming the final k-space data set.

13. The method as recited in claim 1 in which step d) includes selecting a plurality of said k-space data sets and combining the selected k-space data sets to form the final k-space data set.

14. The method as recited in claim 13 which includes:
 calculating the mean value of the signal strength indicators of the k-space data sets; and
 weighting each selected k-space data set before combining it to form the final k-space data set.

15. The method as recited in claim 14 in which the weighting is performed by multiplying values in the selected k-space data set by a weighting factor proportional to the difference between the mean value of the signal strength indicators of the k-space data sets and the signal strength indicator of the selected k-space data set.

16. A method for detecting the arrival of an injected contrast agent in a field of view in a subject placed in an MRI system, the steps comprising:
 a) performing a pulse sequence with the MRI system to acquire NMR data which samples k-space in the field of view;
 b) repeating step a) a plurality of times to acquire a plurality of k-space samples from the field of view;
 c) calculating a signal strength indicator for the acquired plurality of k-space samples;
 d) repeating steps a) through c) a plurality of times to produce a series of calculated signal strength indicators; and
 e) indicating the arrival of the contrast agent in the field of view when a calculated signal strength indicator exceeds a threshold value.

17. The method as recited in claim 16 in which a time delay $\Delta t$ is measured between the injection of the contrast agent in the subject and its indicated arrival in the field of view.

18. The method as recited in claim 17 in which a second injection of contrast agent is made in the patient and an MRA image is acquired with the MRI system by:
 signaling the patient to breath-hold at a time after the second injection based upon the value $\Delta t$;
 acquiring NMR image data after commencement of the breath-hold; and
 reconstructing an MRA image from the acquired NMR image data.

* * * * *